United States Patent [19]

Verhoeven et al.

[11] Patent Number: 4,723,111

[45] Date of Patent: Feb. 2, 1988

[54] AMPLIFIER ARRANGEMENT

[75] Inventors: Bernardus Verhoeven; Martinus J. van den Bungelaar, both of Nijmegen, Netherlands

[73] Assignee: U.S. Philips Corporation, New York, N.Y.

[21] Appl. No.: 885,355

[22] Filed: Jul. 14, 1986

[30] Foreign Application Priority Data

Aug. 30, 1985 [NL] Netherlands ............... 8502380

[51] Int. Cl.[4] ..................... H03F 3/45; H03F 3/26
[52] U.S. Cl. ............................. 330/255; 330/273; 330/271
[58] Field of Search ............... 330/255, 262, 272, 273, 330/271

[56] References Cited

U.S. PATENT DOCUMENTS 4,476,441 10/1984 Gulczynski ............... 330/273

Primary Examiner—Gene Wan
Attorney, Agent, or Firm—Thomas A. Briody; William J. Streeter; Gregory P. Gadson

[57] ABSTRACT

In an output amplifier (20) which is operated in class AB with the aid of quiescent-current means (40, 50) and which comprises first output-transistor configuration ($T_{10}$–$T_{14}$) and a second output-transistor configuration ($T_{15}$–$T_{17}$) with output transistors ($T_{14}$, $T_{17}$) of the same conductivity type, the drive signals for these output-transistor configurations are derived from the output signal ($V_i$) of the input amplifier (10) by means of a single voltage-to-current converter (30). In the case of a positive drive of the first output transistor configuration ($T_{10}$–$T_{14}$) this converter (30), together with the first output-transistor configuration ($T_{10}$–$T_{14}$) and a load ($R_L$) connected to the output (5) of the output amplifier (20), constitutes an amplifier configuration with full negative feedback, while in the case of a positive drive of the second output transistor configuration ($T_{15}$–$T_{17}$) the converter (30) together with the second output transistor configuration ($T_{15}$–$T_{17}$) and the load ($R_L$) also constitutes an amplifier configuration with full negative feedback. As a result of this negative feedback non-linearity of the output transistors is reduced substantially, so that the output voltage ($V_O$) accurately follows the input voltage ($V_i$).

6 Claims, 1 Drawing Figure

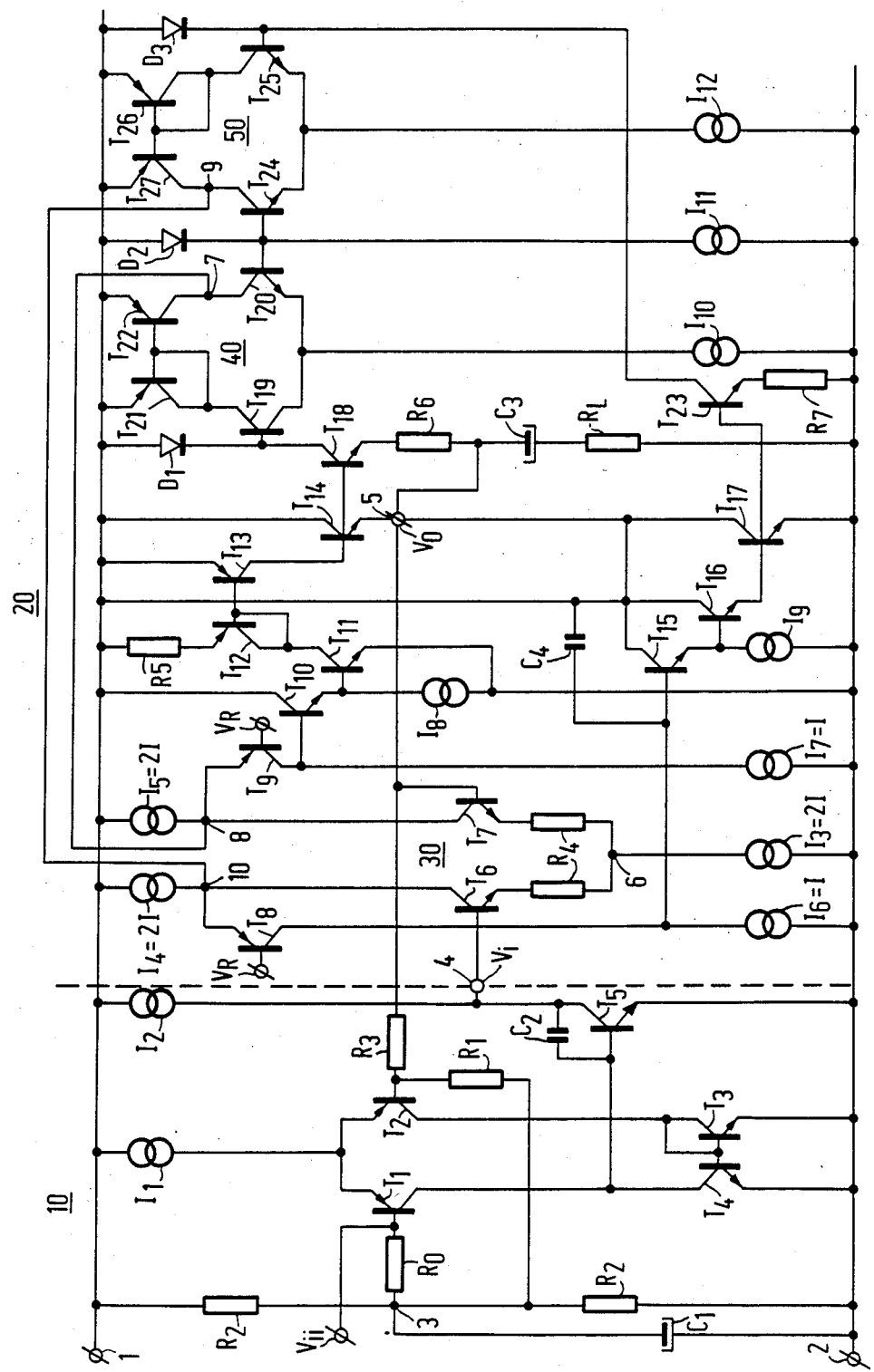

4,723,111

AMPLIFIER ARRANGEMENT

BACKGROUND OF THE INVENTION

The invention relates to an amplifier arrangement comprising a first output transistor and a second output transistor of the same conductivity type whose collector-emitter paths are arranged in series between two power-supply terminals, the emitter of the first transistor and the collector of the second transistor being coupled to an output terminal for connection to a load, means for obtaining a quiescent current in the first output transistor and the second output transistor, and a voltage-to-current converter having a first input connected to an input terminal for receiving an input voltage, a second input connected to the output terminal, and a first output connected to the second transistor for supplying to the second output transistor a first driving current which is proportional to the input voltage, the voltage-to-current converter together with the second output transistor and the load operating as a first amplifier configuration which receives full negative feedback for first driving currents which cause the second transistor to become more conductive.

Such an amplifier arrangement may be used for general purposes and is particularly suitable for use in audio circuits.

Such an arrangement is employed in the Philips integrated audio amplifier which is commercially available under type number IC TDA 1514 at the time of filing of the present application. In this amplifier a small quiescent current flows in the output transistors, so that the amplifier operates in class A-B. The input voltage is applied directly to the base of the first transistor. The voltage-to-current converter converts the resulting increase or decrease of the base-emitter voltage of this transistor into a driving current, which is applied to the base of the second output transistor in such a way that the second output transistor is driven in push-pull with the first output transistor.

In this way the first output transistor is driven further into conduction and the second output transistor is almost cut off for positive input voltages and the first output transistor is almost cut off and the second output transistor is driven further into conduction for negative input voltages. If the second output transistor receives a positive drive distortion of the output voltage as a result of the non-linearity of the second output transistor is very low, because this second output transistor together with the voltage-to-current converter and the load then operates as an amplifier configuration which receives full negative feedback. In the case of a positive drive of the first output transistor distortion of the output voltage as a result of the non-linearity of the first output transistor is reduced by positive feedback, the difference between the input voltage and the output voltage being added to the input voltage as an error-correction signal. However, this positive feedback has the disadvantage that it requires a critical design of the arrangement, because otherwise instabilities are liable to occur.

SUMMARY OF THE INVENTION

Therefore, it is the object of the invention to provide an amplifier arrangement in which the non-linearity due to the first output transistor is reduced in a simple way. To achieve this, according to the invention an amplifier arrangement of the type defined in the opening paragraph is characterized in that the voltage-to-current converter comprises a second output connected to the first transistor, for supplying to the first output transistor a second driving current equal to the first driving current but in phase opposition, the voltage-current converter together with the first output transistor and the load operating as a second amplifier configuration which receives full negative feedback for second driving currents which cause the first transistor to become more conductive. The invention is based on the recognition of the fact that it is possible to generate the driving current for both the first output transistor by means of a single voltage-to-current converter in such a way that in the case of a positive drive of the first output transistor this converter together with the first output transistor and the load constitutes an amplifier configuration which receives full negative feedback and in such a way that in the case of a positive drive of the second output transistor the converter together with the second output transistor and the load also constitutes an amplifier configuration which receives full negative feedback. This results in a substantial reduction of distortion of the output voltage caused by non-linearity of both the first output transistor and the second output transistor.

In one embodiment the amplifier arrangement is characterized in that the voltage-to-current converter comprises two transistors arranged as a differential pair with a resistor connected between their emitters, the base of one transistor being connected to the first input and the base of the other transistor being connected to the second input, which differential pair is energized by a first current source coupled to one power supply terminal, which transistors each have their collectors coupled to the other power-supply terminal via identical second current sources and to the one power supply terminal via identical series connections of the emitter-collector path of a current-follower transistor and a third current source which current-follower transistor is of a conductivity type opposite to that of the transistors of the differential pair and whose base carries reference voltage, the difference between the currents from the second current source and the third current source being substantially equal to half the current from the first current source, the collector of one current-follower transistor constituting the first output and the collector of the other current-follower transistor constituting the second output. An advantageous embodiment is characterized in that the means for causing the quiescent current to flow in the first transistor and in the second transistor for each of these transistors are constituted by a differential amplifier having an inverting input, a non-inverting input and an output, the inverting input carrying a reference voltage produced across a first reference element, the non-inverting input carrying a voltage produced across a second reference element identical to said first reference element, which voltage is produced by a current which is proportional to the current flowing in the relevant output transistor, and the output being connected to the emitter of the current-follower transistor which is coupled to the relevant output transistor.

BRIEF DESCRIPTION OF THE DRAWING

An amplifier arrangement in accordance with the invention will now be described in more detail, by way of example, with reference to the accompanying drawing.

DETAILED DESCRIPTION OF THE DRAWING

The FIGURE shows an amplifier arrangement comprising an input amplifier 10 and an output amplifier 20 which is an example of the actual subject of the present Application. The input amplifier 10 comprises two transistors $T_1$, $T_2$ which are arranged as a differential pair and which are energized by current source $I_1$. The bases of the transistors $T_1$, $T_2$ are connected to a junction point 3 via resistors $R_0$ and $R_1$ respectively, which point is d.c. biassed to half the power-supply voltage by means of a voltage divider comprising resistors $R_2$ arranged between the positive power-supply terminal 1 and the negative-power supply terminal 2. For input signals this point 3 is earthed by means of a capacitor $C_1$. The input signal $V_{ii}$ is applied to the base of the transistor $T_1$. The base of the transistor $T_2$ is coupled to the output 5 of the output amplifier 20 via a feedback resistor $R_3$, so that a fraction of the output signal determined by the voltage divider $R_1$, $R_3$ is applied to the base of the transistor $T_2$. The collector of the transistor $T_1$ is connected directly to the base of a transistor $T_5$ and the collector of the transistor $T_2$ is connected to the base of the transistor $T_5$ via a current mirror comprising the transistors $T_3$, $T_4$, negative feed back being provided from the collector of the transistor $T_5$ to its base via a capacitor $C_2$ which collector is also connected to the positive power-supply terminal 1 via a current source $I_2$. The collector of the transistor $T_5$ constitutes the output of the input amplifier, which is connected to the input 4 of the output amplifier 20. This output amplifier comprises a voltage-to-current converter 30 comprising transistors $T_6$ and $T_7$ whose emitters are each connected to the output 6 of a current source $I_3=2I$ via a respective resistor $R_4$. The base of the transistor $T_6$ is connected to the input 4 and the base of the transistor $T_7$ is connected to the output 5 of the output amplifier. The collector of the transistor $T_6$ is connected to the positive power-supply terminal 1 via a current source $I_4=2I$ and is also connected to the emitter 10 of a current-follower transistor $T_8$ whose base carries a reference voltage $V_R$ and whose collector is connected to the negative power-supply terminal 2 via a current source $I_6=I$. Similarly, the collector of the transistor $T_7$ is connected to the positive power-supply terminal 1 via a current source $I_5=2I$, and is also connected to the emitter 8 of the current-follower transistor $T_9$ whose base carries the reference voltage $V_R$ and whose collector is connected to the negative power-supply terminal 2 via a current source $I_7=I$. The collector of the transistor $T_9$ is connected to the base of an emitter-follower transistor $T_{10}$ which forms part of the first output-transistor configuration $T_{10}$ to $T_{14}$. The emitter of the transistor $T_{10}$ is connected to the negative power-supply terminal 2 via a current source $I_8$ and to the base of a transistor $T_{11}$ whose collector is connected to the input of a current mirror comprising a diode-connected transistor $T_{12}$ whose emitter is connected to the positive power-supply terminal 1 via a resistor $R_5$ and a transistor $T_{13}$ whose emitter is connected directly to the positive power-supply terminal 1. The collector of the transistor $T_{13}$ is connected to the base of the first output transistor $T_{14}$ whose emitter is connected to the output 5, to which the load $R_L$ is connected via a capacitor $C_3$. The collector of the transistor $T_8$ is connected to the base of an emitter-follower transistor $T_{15}$ which forms part of the second output transistor configuration $T_{15}$ to $T_{17}$. The emitter of the transistor $T_{15}$ is connected to the negative power-supply terminal 2 via a current source $I_9$ and also to the base of a transistor $T_{16}$ whose collector is connected to the collector of the transistor $T_{15}$ also to the positive power-supply terminal 1. The transistor $T_{16}$ and the second output transistor $T_{17}$, whose collector is connected to the output 5, are connected as a Darlington pair. The series connection of the base-emitter junction of a transistor $T_{18}$ and the resistor $R_6$ is arranged in parallel with the base-emitter junction of the transistor $T_{14}$. This series connection forms part of the first means 40 for causing a quiescent current to flow in the first output transistor configuration $T_{10}$ to $T_{14}$. The collector of the transistor $T_{18}$ is connected to the positive power-supply terminal 1 via a diode $D_1$ and also to the base of a transistor $T_{19}$, which together with the transistor $T_{20}$ is arranged as a differential amplifier which is energized by a current source $I_{10}$. The base of the transistor $T_{19}$ constitutes the non-inverting input and the base of the transistor $T_{20}$ constitutes the inverting input of this differential amplifier. The base of the transistor $T_{20}$ is connected to the positive power-supply terminal 1 via a diode $D_2$ and to the negative power-supply terminal 2 via a current source $I_{11}$. The collector of the transistor $T_{19}$ is connected to collector of transistor 20 via a current mirror comprising the transistors $T_{21}$ and $T_{22}$ and the collector of the transistor $T_{20}$ is connected directly to the output 7 of this differential amplifier, which is connected to the emitter 8 of the transistor $T_9$. Similarly, the series connection of the base-emitter junction of a transistor $T_{23}$ and a resistor $R_7$ is connected in parallel with the base-emitter junction of the transistor $T_{17}$ and forms part of the second means 50 for causing a quiescent current to flow in the second output transistor configuration $T_{15}$ to $T_{17}$ which means comprises the differential pair $T_{24}$, $T_{25}$, the current mirror $T_{26}$, $T_{27}$, the diode $D_3$ and the current source $I_{12}$ and which is similar to the first means 40. The output 9 of the second means is connected to the emitter 10 of the transistor $T_8$.

For the operation of the arrangement the d.c. setting of the arrangement in the absence of an input signal $V_{ii}$ will be considered first. The input amplifier 10 is of a customary construction and its operation is assumed to be known. By means of the negative-feedback path $R_1$, $R_3$, $C_1$ the output 5 and the input 4 are set to the same voltage as point 3, i.e. to half the power-supply voltage. The voltages on the bases of the transistors $T_7$ and $T_6$ are therefore equal, so that the current $I_3=2I$ is uniformly distributed between the transistors $T_6$, $T_7$. The current $I$ in the transistor $T_6$ is supplied by the current source $I_4=2I$. The residual current $I$ from this current source $I_4$ flows through the transistor $T_8$ and is wholly absorbed by the current source $I_6=I$. Similarly, the current $I$ in the transistor $T_7$ is supplied by the current source $I_5=2I$ and the remainder is absorbed by the current source $I_7$ via the transistor $T_9$.

The voltage on the base of the transistor $T_{20}$ is equal to the positive supply voltage minus the voltage across the diode $D_2$ which is determined by the current source $I_{11}$. The differential amplifier $T_{19}$, $T_{20}$ produces a current on its output 7, which current is applied to the emitter of the transistor $T_9$, so that the voltage on the base of the transistor $T_{10}$ is fixed at a specific value. Consequently, a current will flow through the output transistor $T_{14}$ via the transistors $T_{11}$, $T_{12}$ and $T_{13}$ and thus through the transistor $T_{18}$. The differential amplifier $T_{19}$, $T_{20}$ controls the voltage on the base of the transistor $T_{10}$ and hence the current through the transistor $T_{18}$ in such a way that the voltage across the diode $D_1$ becomes equal to the voltage across the diode $D_2$, so that the voltage on the base of the transistor $T_{19}$ becomes equal to the voltage on the base of the transistor $T_{20}$. The current through the transistor $T_{18}$ is therefore accurately defined, so that the quiescent current in the first output transistor $T_{14}$ is also accurately defined. The resistor $R_6$ arranged in the emitter line of the transistor $T_{18}$ then ensures that only a fraction of the current through the transistor $T_{14}$ flows through this transistor $T_{18}$ so as to minimize the dissipation in the latter transistor. Similarly with the aid of the second means 50 the quiescent current in the second output transistor $T_{17}$ is defined, the differential amplifier $T_{24}$, $T_{25}$ defining the voltage on the base of the transistor $T_{15}$ via the transistor $T_{18}$ in such a way that the voltage across the diode $D_3$ becomes equal to the voltage across the diode $D_2$, so that the voltage on the base of the transistor $T_{25}$ becomes equal to that on the base of the transistor $T_{24}$. The first output transistor configuration and the second output transistor configuration are dimensioned in such a way that their current gains are equal. The quiescent current in the first output transistor $T_{14}$ is therefore equal to the quiescent current in the second output transistor $T_{17}$.

Now the operation of the arrangement for a signal voltages will be considered. It is simple to demonstrate that a positive signal voltage $V_{ii}$ applied to the base of the transistor $T_1$ results in a positive signal voltage $V_i$ on the base of the transistor $T_6$. The voltage $V_0$ on the output 5 and hence that on the base of the transistor $T_6$ initially remains the same, so that transistor $T_6$ becomes more conductive and the transistor $T_7$ becomes less conductive. This results in a signal current $+i$ in the collector of the transistor $T_6$ and a signal current $-i$ in the collector of the transistor $T_7$. This last-mentioned signal current results in a signal current $+i$ in the transistor $T_9$, which leads to an increase in base-emitter voltage of the transistor $T_{10}$, the signal current $+i$ flowing in the base of the transistor $T_{10}$. As a result of this, the voltage on the base of the transistor $T_{11}$ increases, which results in a signal current in the collector of the transistor $T_{11}$, which is subsequently mirror-inverted relative to the positive supply voltage by the current-mirror circuit $T_{11}$, $R_5$, $T_{10}$, which also provides a specific amplification, after which it is applied to the base of the transistor $T_{14}$. Consequently, the output current through the load $R_L$ increases so that the output voltage $V_o$ and hence the voltage on the base of the transistor $T_7$ increases. The voltage-to-current converter 30 together with the first output transistor configuration $T_{10}$ to $T_{14}$ and the load $R_L$ thus constitutes an amplifier arrangement with full negative feedback, the base of the transistor $T_6$ constituting the non-inverting input and the base of the transistor $T_7$ constituting the inverting input. As a result of the full negative feedback the voltage $V_0$ on the output 5 is controlled so as to become substantially equal to the input voltage $V_i$ on the non-inverting input 4. As a result of this the output voltage $V_0$ very accurately follows the input voltage $V_i$. This full negative feedback substantially reduces the distortion of the output voltage which occurs in the known circuit arrangement as a result of the non-linearity of the first output-transistor configuration $T_{10}$–$T_{14}$ which is arranged as an emitter-follower.

The increasing current in the transistor $T_{14}$ caused by the positive input voltage $V_i$ also leads to an increase of the current in the transistor $T_{18}$, so that the voltage on the base of the transistor $T_{19}$ decreases relative to that on the base of the transistor $T_{20}$. This results in a decrease of the quiescent current in the output transistor $T_{14}$.

As already stated, the positive signal voltage $V_i$ causes a signal current $+i$ in the collector of the transistor $T_6$ which results in a signal current $-i$ in the transistor $T_8$. As a result of this, the voltage on the base of the transistor $T_{15}$ decreases, so that the collector current of the transistor $T_{17}$ decreases slightly. However, the collector current of the transistor $T_{23}$ then also decreases slightly so that the voltage on the base of the transistor $T_{25}$ increases relative to the voltage on the base of the transistor $T_{24}$. The output 8 of the differential amplifier 50 then controls the voltage on the base of the transistor $T_{15}$ in such a way that the current in the transistor $T_{23}$ produces a voltage drop across the diode $D_3$ which is equal to that across the diode $D_2$, so that the quiescent-current setting of the transistor $T_{17}$ remains the same. This ensures that the second output transistor configuration is not turned off when the first output transistor configuration $T_{10}$ to $T_{14}$ is driven.

A negative signal voltage $V_i$ on the base of the transistor $T_6$ results in a signal current $-i$ in the collector of the transistor $T_6$ and in the signal current $+i$ in the collector of the transistor $T_7$. The signal current $-i$ in the collector of the transistor $T_6$ results in a signal current $+i$ in the transistor $T_8$. As a result of this, the base-emitter voltage of the transistor $T_{15}$ increases, causing a signal current $+i$ to flow in the base of the transistor $T_{15}$. After amplification by the transistors $T_{16}$ and $T_{17}$ this results in an increase of the collector current of the transistor $T_{14}$, which current flows through the load $R_L$. As a result of this, the output voltage $V_0$ and consequently the voltage on the base of the transistor $T_7$ decreases. The voltage-to-current converter 30 together with the second output transistor configuration $T_{15}$ to $T_{17}$ and the load $R_L$ thus constitutes an amplifier circuit with full negative feedback, the capacitor $C_4$, in the same way as the capacitor $C_2$ for the entire amplifier, ensuring a stable loop gain. As a result of the full negative feedback the voltage $V_0$ is again controlled to become substantially equal to the voltage $V_i$. This leads to a substantial reduction of the distortion of the output voltage $V_0$ caused by the non-linearity of the second output-transistor configuration $T_{15}$ to $T_{17}$.

In the same way as described for positive input voltages, the quiescent current through the second output transistor configuration $T_{15}$ to $T_{17}$ decreases slightly for negative input voltages $V_i$, while the quiescent current through the first output transistor configuration $T_{10}$ to $T_{14}$ remains the same.

In the manner described in the foregoing the voltage-to-current converter 30 is employed to supply the drive signal for the first output transistor configuration and the second output transistor configuration for positive and negative input voltages $V_i$ respectively, the converter 30 together with this first output transistor configuration or this second output transistor configuration constituting an amplifier circuit with full negative feedback, so that the output signal $V_0$ accurately follows the input signal $V_i$. Owing to the low distortion of the output signal $V_0$ the negative feedback between the output 5 and the inverting input of the entire amplifier, i.e. the base of the transistor $T_2$ can be very small, which is favourable in view of the stability of the amplifier.

The invention is not limited to the present embodiment, a large number of variants being possible within the scope of the invention as defined by the claims. For example, the first output-transistor configuration may be constructed in the same way as the second output transistor configuration. Alternatively, the first output transistor configuration and the second output transistor configuration may be constructed in any other way provided that the first output transistor and the second output transistor are of the same conductivity type. The voltage-to-current converter may also be constructed in another way. For example, this converter may be extended by elements for increasing the linearity of the voltage-to-current conversion. Alternatively, the converter may be equipped with PNP transistors instead of NPN transistors. The quiescent-current setting may also be realized in any other way than that shown. Further, bootstrapping may be applied in order to increase the output-voltage swing of the amplifier. Finally, it is to be noted that instead of an asymmetrical power supply the amplifier may employ a symmetrical power supply, in which case the load should be connected directly to the output of the amplifier.

We claim:

1. An amplifier arrangement comprising a first output transistor and a second output transistor of the same conductivity type whose collector-emitter paths are arranged in series between two power-supply terminals, the emitter of the first output transistor and the collector of the second output transistor being coupled to an output terminal for connection to a load, means for obtaining a quiescent current in the first output transistor and the second output transistor, and a voltage-to-current converter having a first input coupled to an input terminal for receiving an input voltage, a second input coupled to the output terminal, and a first output coupled to the second output transistor for supplying to the second output transistor a first driving current which is proportional to the input voltage, the voltage-to-current converter together with the second output transistor and the load operating as a first amplifier configuration which receives full negative feedback for first driving currents which cause the second output transistor to become more conductive, characterized in that the voltage-to-current converter comprises a second output coupled to the first transistor, for supplying to the first output transistor a second driving current equal to the first driving current but in phase opposition, the voltage-current converter together with the first output transistor and the load operating as a second amplifier configuration which receives full negative feedback for second driving currents which cause the first output transistor to become more conductive.

2. An amplifier arrangement as claimed in claim 1, characterized in that the voltage-to-current converter comprises two transistors arranged as a differential pair with a resistor coupled between their emitters, the base of one transistor being coupled to the first input and the base of the other transistor being coupled to the second input, which differential pair is energized by a first current source coupled to one power supply terminal, which transistors each have their collectors coupled to the other power-supply terminal via identical current sources and to the one power-supply terminal via identical series couplings of the emitter-collector path of a current-follower transistor, and a third current source, which current-follower transistor is of a conductivity type opposite to that of the transistors of the differential pair and whose base carries a reference voltage, the difference between the currents from the second current source and the third current source being substantially equal to half the current from the first current source, the collector of one current-follower transistor constituting the first output and the collector of the current-follower transistor constituting the second output.

3. An amplifier arrangement as claimed in claim 2, characterized in that the means for causing the quiescent current to flow in the first output transistor and in the second output transistor for each of these transistors are constituted by a differential amplifier having an inverting input, a non-inverting input and an output, the inverting input carrying a reference voltage produced across a first reference element, the non-inverting input carrying a voltage produced across a second reference element identical to said first reference element, which voltage is produced by a current which is proportional to the current flowing in the relevant output transistor, and the output being coupled to the emitter of the current-follower transistor which is coupled to the relevant output transistor.

4. An amplifier arrangement as claimed in claim 3, characterized in that the first reference element is common to the first output transistor and the second output transistor.

5. An amplifier arrangement as claimed in claim 1, characterized in that the means for causing the quiescent current to flow in the first output transistor and in the second output transistor for each of these transistors are constituted by a differential amplifier having an inverting input, a non-inverting input and an output, the inverting input carrying a reference voltage produced across a first reference element, the non-inverting input carrying a voltage produced across a second reference element identical to said first reference element, which voltage is produced by a current which is proportional to the current flowing in the relevant output transistor, and the output being coupled to the emitter of a current-follower transistor which is coupled to the relevant output transistor.

6. An amplifier arrangement as claimed in claim 5, characterized in that the first reference element is common to the first output transistor and the second output transistor.

* * * * *